(12) United States Patent
Gurin

(10) Patent No.: US 9,828,238 B2
(45) Date of Patent: Nov. 28, 2017

(54) MEMS CAVITY SUBSTRATE

(71) Applicant: InvenSense, Inc., San Jose, CA (US)

(72) Inventor: Ilya Gurin, Mountain View, CA (US)

(73) Assignee: INVENSENSE, INC., San Jose, CA (US)

( * ) Notice: Subject to any disclaimer, the term of this patent is extended or adjusted under 35 U.S.C. 154(b) by 80 days.

(21) Appl. No.: 15/144,046

(22) Filed: May 2, 2016

(65) Prior Publication Data

US 2016/0244324 A1    Aug. 25, 2016

Related U.S. Application Data

(63) Continuation of application No. 14/564,725, filed on Dec. 9, 2014, now Pat. No. 9,340,409.

(51) Int. Cl.
   *B81B 7/02* (2006.01)
   *B81B 7/00* (2006.01)
   *B81C 1/00* (2006.01)

(52) U.S. Cl.
   CPC .......... *B81B 7/0058* (2013.01); *B81B 7/0048* (2013.01); *B81C 1/00674* (2013.01); *B81B 2203/0315* (2013.01); *B81B 2207/012* (2013.01)

(58) Field of Classification Search
   CPC .................................................... B81B 7/0048
   See application file for complete search history.

(56) References Cited

U.S. PATENT DOCUMENTS

2007/0290364 A1\* 12/2007 Gupta ..................... B81B 7/007
                                                                  257/777

\* cited by examiner

*Primary Examiner* — Daniel Shook
(74) *Attorney, Agent, or Firm* — McAndrews, Held & Malloy, Ltd.

(57) ABSTRACT

In accordance with an example embodiment of this disclosure, a micro-electro-mechanical system (MEMS) device comprises a substrate, a CMOS die, and a MEMS die, each of which comprises a top side and a bottom side. The bottom side of the CMOS die is coupled to the top side of the substrate, and the MEMS die is coupled to the top side of the CMOS die, and there is a cavity positioned between the CMOS die and the substrate. The cavity may be sealed by a sealing substance, and may be filled with a filler substance (e.g., an adhesive) that is different than the sealing substance (e.g., a gaseous or non-gaseous substance). The cavity may be fully or partially surrounded by one or more downward-protruding portions of the CMOS die and/or one or more upward-protruding portions of the substrate.

20 Claims, 5 Drawing Sheets

MEMS CAVITY SUBSTRATE

CROSS-REFERENCE TO RELATED APPLICATIONS/INCORPORATION BY REFERENCE

This patent application is a continuation of U.S. patent application Ser. No. 14/564,725, filed on Dec. 9, 2014, and titled "MEMS CAVITY SUBSTRATE," which is hereby incorporated herein by reference in its entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Various devices, for example MEMS devices, are susceptible to failure or performance change due to substrate flexing. For example, a flexing motherboard and/or package substrate may damage or change the performance parameters of a MEMS structure mounted thereon.

SUMMARY

Various aspects of this disclosure provide a device structure and method for forming a device structure that is robust with regard to substrate flexing. In a non-limiting example, an electromechanical device comprising MEMS and CMOS elements is formed that comprises a stress isolation gap positioned between the MEMS/CMOS structure and a substrate.

DETAILED DESCRIPTION OF VARIOUS ASPECTS OF THE DISCLOSURE

Figure 1:
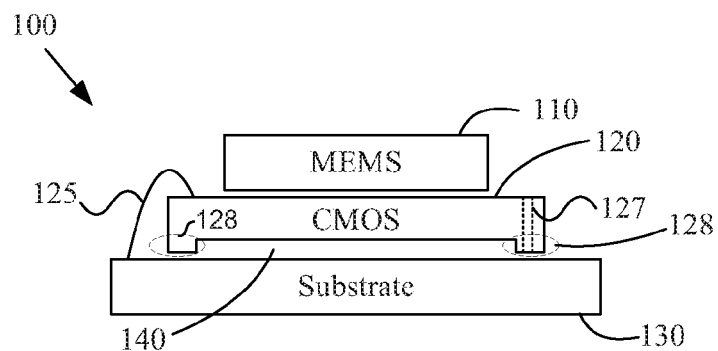
FIG. 1 shows an example electromechanical circuit structure comprising a stress isolation gap formed in a CMOS die, in accordance with various aspects of the present disclosure.

FIG. 1 shows an example electromechanical circuit structure 100 comprising a stress isolation gap formed in a CMOS die, in accordance with various aspects of the present disclosure.

The circuit structure 100 may, for example, comprise a micro-electro-mechanical system (MEMS) die 110. The MEMS die 110 may, for example, comprise at least one of any of a variety of MEMS structures (e.g., MEMS sensor structures). For example, the MEMS die 110 may comprise one or more of a gyroscope, a compass, a magnetometer, an accelerometer, a microphone, a pressure sensor, a proximity sensor, a moisture sensor, a temperature sensor, a biometric sensor, and/or an ambient light sensor, among others known in the art. The MEMS die 110 may, for example, comprise a top side, a bottom side, and side edges. The top side may, for example, comprise MEMS sensors and/or other MEMS structures. The bottom side may, for example, comprise a MEMS substrate. The top and bottom sides may alternatively be inverted. Though the discussion will generally refer to a MEMS die 110, it should be understood that the MEMS die 110 may also be in wafer form (e.g., prior to singulating the wafer into individual die and/or sets of die).

The circuit structure 100 may, for example, comprise a CMOS die 120. The CMOS die 120 may, for example, comprise sensor processing circuitry (e.g., a motion processing unit, audio signal processor, biometric signal processor, environmental processor, etc.). The CMOS die 120 may, for example comprise a top side, a bottom side, and side edges. The top side may for example comprise an active semiconductor surface, and the bottom side may for example comprise an inactive surface. The top and bottom sides may alternatively be inverted. As with the MEMS die 110, it should be understood that the CMOS die 120 may also be in wafer form (e.g., prior to singulating the wafer into individual die and/or sets of die). Additionally, though only one CMOS die 120 is illustrated, it should be understood that a plurality of CMOS die may be stacked at item 120. Additionally, though a CMOS die is utilized as an example, in FIG. 1 and in all figures herein, the scope of this disclosure is by no means limited to a CMOS die. For example, any of a variety of different types of integrated circuit (or semiconductor) dies may be utilized without departing from the spirit and scope of this disclosure.

The MEMS die 110 may, for example, be coupled to the CMOS die 120. For example, the bottom side of the MEMS die 110 may be directly and/or indirectly (e.g., with intervening layers) coupled to the top side of the CMOS die 120. Such mechanical and/or electrical coupling may be performed in any of a variety of manners. In an example embodiment, the first substrate is attached to the second substrate through wafer bonding, as described in commonly owned U.S. Pat. No. 7,104,129, which is hereby incorporated herein by reference in its entirety, to simultaneously provide electrical connections and hermetically seal the MEMS devices. The MEMS die 110 and CMOS die 120 may, for example, be coupled to the CMOS die 130 using solder bonding, adhesive bonding, etc. The MEMS die 110 and CMOS die 120 may, for example, be electrically coupled using wire-bonding, TSV technology (e.g., with backside bumping technology, etc.).

The circuit structure 100 may, for example, comprise a substrate 130. The substrate 130 may comprise characteristics of any of a variety of different substrates. For example, the substrate 130 may comprise a printed circuit board (PCB), lead frame paddle, silicon die or wafer, glass, etc. As will be discussed in greater detail herein, the substrate 130 may comprise an interposer between the CMOS die 120 and/or another substrate (e.g., a packaging substrate). Also for example, the substrate 130 may comprise a package substrate, such as may be used to provide electrical connectivity between circuitry in an electronic package and an external print circuit board (e.g., a product mother board). Further for example, the substrate 130 may comprise a mother board substrate (e.g., a circuit board to which device packages are typically coupled).

The CMOS die 120 may, for example, be coupled to the substrate 130. For example, the bottom side of the CMOS die 120 may be directly and/or indirectly (e.g., with intervening layers) coupled to the top side of the substrate 130. The CMOS die 120 may be coupled to the substrate 130 in any of a variety of manners. For example, the CMOS die 120 may be mechanically coupled to the substrate 130 using a die-attach film and/or adhesive, and electrically coupled to the substrate 130 using wire-bonds 125. In an example implementation in which die-attach film is utilized to couple the CMOS die 120 and the substrate 130, the die-attach film may be formed to coincide with the downward-protruding portions 128 of the CMOS die 120 discussed herein, or alternatively formed to cover the entire substrate, at least beneath the CMOS die 120. Also for example, the CMOS die 120 may be mechanically coupled to the substrate 130 using solder and/or conductive adhesive, and electrically coupled to the substrate 130 via the solder and through-silicon vias (TSVs) 127 extending between the top and bottom sides of the CMOS die 120.

Coupling the CMOS die 120 to the substrate 130 may, for example, be performed before and/or after coupling the MEMS die 110 to the CMOS die 120. For example, the MEMS die 120 and the CMOS die 120 may be coupled (e.g., using the technique(s) described in incorporated U.S. Pat. No. 7,104,129), prior to coupling the CMOS die 120 (in die or wafer form) to the substrate 130. In another example, the CMOS die 120 may be coupled to the substrate 130 prior to coupling the MEMS die 110 to the CMOS die 120.

All couplings discussed herein may, for example, be performed at the die and/or wafer level. For example, the MEMS die 110, CMOS die 120, and substrate 130 may all be bonded to each other at the wafer level prior to singulation into separate circuit packages.

The circuit structure 100 comprises a stress isolation gap 140 between the CMOS die 120 and the substrate 130. The gap 140 may, for example, be filled with any gaseous (e.g., air) or non-gaseous (e.g., foam) substance having a suitable compliance (inverse of spring constant) that absorbs stress such that stress transferred from the substrate 130 to the CMOS die 120 and/or MEMS die 110 is below a level determined likely to cause damage or performance degradation.

The gap 140 may, for example, reduce stress on the CMOS die 120 and/or the MEMS die 110 due to flexing of the substrate 130. For example, the substrate 130 may bow into or away from the gap 140 such that a substantially lower amount of stress is placed on the CMOS die 120 and/or the MEMS die 110 than would have resulted without the gap 140. For example, if instead of the gap 140, the CMOS die 120 and the substrate 130 were tightly coupled over the entirety of their facing sides, the substrate 130 flexing might cause the CMOS die 120 (and thus the MEMS die 110) to also flex in unison. Such flexing of the CMOS die 120 and MEMS die 110 might, for example, cause the circuit structure 100 to fail, reduce performance of the circuit structure 100, alter performance characteristics of the circuit structure 100, etc.

As shown in FIG. 1, the stress isolation gap 140 may comprise a cavity formed in the CMOS die 120. The cavity may, for example, be completely or partially surrounded laterally by one or more downward-protruding portions 128 of the CMOS die 120. For example, the downward-protruding portion(s) 128 of the CMOS die 120 may extend fully around the entire perimeter of the CMOS die 120. Also for example, the downward-protruding portion(s) 128 of the CMOS die 120 may be segmented into two or more segments, each of which only extends partially around the perimeter of the CMOS die 120. For example, the downward-protruding portion(s) 128 of the CMOS die 120 may comprise four corner posts (or feet), each protruding downward at a respective corner of the CMOS die 120. Such posts may, for example, comprise a rectangular footprint (e.g., looking up or down at the post), a circular footprint, an elliptical footprint, etc. Also for example, as will be discussed herein, the downward-protruding portion(s) 128 may comprise a single solid protrusion or pedestal (e.g., extending from the center of the bottom side of the CMOS die 120, offset from the center of the CMOS die 120 yet still covering the center, offset from the center of the CMOS die 120 and not covering the center of the CMOS die 120, etc.).

In an example implementation in which wire-bonding is utilized for electrically coupling the CMOS die 120 to the substrate 130, the downward-protruding portion(s) 128 of the CMOS die 120 may be positioned directly below wire-bond pads that are on the top side of the CMOS die 120. In such a configuration, the downward-protruding portion(s) 128 may provide structural support during the wire-bonding process.

The cavity and/or downward-protruding portion(s) 128 of the CMOS die 120 may be formed in any of a variety of manners. For example, the cavity may be etched into the bottom side of the CMOS die 120. For example, the bottom side (e.g., an inactive surface) of the CMOS die 120 may be masked at the protruding portions and chemically etched at the non-masked areas to form the cavity. Also for example, in an implementation that comprises feet at the corners of the CMOS die 120, the cavity may be ground into the CMOS die 120. For example, while the CMOS die 120 is still in wafer form, a matrix pattern may be ground into the bottom side of the CMOS die 120 to form the corner feet. The corner feet may, for example, be formed to protrude orthogonally relative to the primary plane of the CMOS die 120, for example generally orthogonal to the top and bottom sides of the CMOS die 120, but may also be formed at a non-orthogonal angle. The corner feet may, for example, be formed thin enough to have a spring-like compliance, which may further isolate the CMOS die 120 and MEMS die 110 from stress due to a flexing substrate 130.

Also for example, the downward-protruding portion(s) 128 may be positively formed on the CMOS die 120 (e.g., as opposed to being negatively formed by surrounding material being removed). For example, the downward-protruding portion(s) 128 may be deposited on the bottom side of the CMOS die. Such downward-protruding portion(s) 128 may, for example, comprise dielectric material that is deposited (e.g., printed, sprayed, vapor-deposited, grown in a MEMS or MEMS-like process, etc.). In an example implementation, the downward-protruding portion(s) 128 may be formed of deposited photoresist material. In such an implementation, the deposited photoresist material may comprise enough adhesion to provide the mechanical coupling between the CMOS die 120 and the substrate 130 (e.g., after curing).

Also for example, such downward-protruding portion(s) 128 may be plated (e.g., electrode-based plating, electroless plating, etc.). In an example implementation, the downward-protruding portion(s) 128 may comprise a metal post that is plated on the bottom surface of the CMOS die 120. In such an example implementation, the metal post may be strictly a mechanical feature, or may also be utilized as an electrical connection. Additionally, in a scenario in which the downward-protruding portion(s) 128 comprise metal posts, other metal posts (e.g., of different dimensions than the downward-protruding portion(s) 128) or conductive features may provide electrical connections between the CMOS die 120 and the substrate 130. For further example, in a scenario in which the downward-protruding portion(s) 128 comprise metal posts, wire-bonds may be utilized to provide electrical connections between the CMOS die 120 and the substrate 130 (e.g., bonded to the top side of the CMOS die 120 and the top side of the substrate 130).

The stress isolation gap 140 may be characterized by any of a variety of dimensions. For example, the gap 140 may be at least 10 microns thick. Also for example, the gap 140 may be at least 15 microns thick. In an example implementation, the gap 140 may comprise a thickness between 1% and 10% of the thickness of the CMOS die 120. In another example implementation, the gap 140 may comprise a thickness greater than 10% of the thickness of the CMOS die 120. The gap 140 may, for example, be at least 80% as wide as the CMOS die 120. Also for example, the gap 140 may be at least 90% as wide as the CMOS die 120.

The stress isolation gap 140 may be formed at various points in the manufacturing process of the circuit structure 100. For example, the cavity in the CMOS die 120 corresponding to the gap 140 may be formed after the MEMS die 110 and the CMOS die 120 have been coupled. Also for example, the cavity in the CMOS die 120 corresponding to the gap 140 may be formed before the MEMS die 110 and CMOS die 120 are coupled.

Note that although the example structure 100 is illustrated with a single CMOS layer, a plurality of such layers and/or other types of layers may be present. In other words, there may be one or more structural layers between the MEMS die 110 and the CMOS die 120.

Though the example circuit 100, shown in FIG. 1, shows the cavity corresponding to the gap 140 formed in the CMOS die 120, the cavity may alternatively be formed in the substrate 130. An example of such a configuration will now be discussed.

Figure 2:
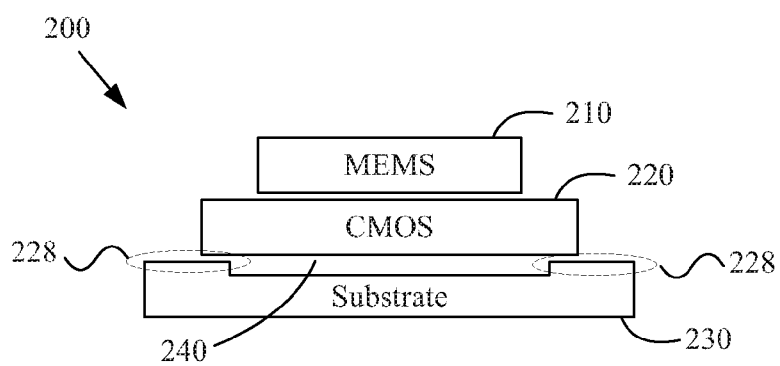
FIG. 2 shows an example electromechanical circuit structure comprising a stress isolation gap formed in a substrate, in accordance with various aspects of the present disclosure.

FIG. 2 shows an example electromechanical circuit structure 200 comprising a stress isolation gap formed in a substrate, in accordance with various aspects of the present disclosure. The example circuit structure 200 may share any or all characteristics with the example circuit structure 100 illustrated in FIG. 1 and discussed herein, including production methods thereof.

The circuit structure 200 may, for example, comprise a stress isolation gap 240 formed in the substrate 230. As discussed herein with regard to the CMOS die, a cavity may be formed in the substrate 230 and positioned below the CMOS die 220 to at least partially isolate the CMOS die 220 from stresses caused by the substrate 230 (e.g., by flexing). The CMOS die 220 may then, for example, span the cavity formed in the substrate 240.

The circuit structure 200 may, for example, comprise a substrate 230. The substrate 230 may comprise characteristics of any of a variety of different substrates. For example, the substrate 230 may comprise a printed circuit board (PCB), lead frame paddle, silicon die or wafer, glass, etc. As will be discussed in greater detail herein, the substrate 230 may comprise an interposer between the CMOS die 220 and another substrate (e.g., a package substrate). Also for example, the substrate 230 may comprise a package substrate, such as may be used to provide electrical connectivity between circuitry in an electronic package and an external printed circuit board (e.g., a product mother board). Further for example, the substrate 230 may comprise a mother board substrate (e.g., a circuit board to which device packages are typically coupled).

The CMOS die 220 may be coupled to the substrate 230 in any of a variety of manners. For example, the CMOS die 220 may be mechanically coupled to the substrate 230 using a die-attach film and/or adhesive, and electrically coupled to the substrate 230 using wire-bonds (e.g., which are not illustrated in FIG. 2, for illustrative clarity). In an example implementation in which die-attach film is utilized to couple the CMOS die 220 and the substrate 230, the die-attach film may be formed to coincide with the upward-protruding portion(s) 228 of the substrate 230 discussed herein, or alternatively formed to cover the entire CMOS die 220, at least above the substrate 230. Also for example, the CMOS die 220 may be mechanically coupled to the substrate 230 using solder and/or conductive adhesive, and electrically coupled to the substrate 230 via the solder and through-silicon vias (TSVs) (e.g., which are not illustrated in FIG. 2 or most other figures herein, for illustrative clarity) extending between the top and bottom sides of the CMOS die 220.

Coupling the CMOS die 220 to the substrate 230 may, for example, be performed before and/or after coupling the MEMS die 210 to the CMOS die 220. For example, the MEMS die 210 and the CMOS die 220 may be coupled (e.g., using the technique(s) described in U.S. Pat. No. 7,104,129, prior to coupling the CMOS die 220 (in die or wafer form) to the substrate 230. In another example, the CMOS die 220 may be coupled to the substrate 230 prior to coupling the MEMS die 210 to the CMOS die 220.

All couplings discussed herein may, for example, be performed at the die and/or wafer level. For example, the MEMS die 210, CMOS die 220, and/or substrate 230 may all be bonded to each other at the wafer level prior to singulation into separate circuit packages.

The circuit structure 200 comprises a stress isolation gap 240 between the CMOS die 220 and the substrate 230. The gap 240 may, for example, be filled with any gaseous (e.g., air) or non-gaseous (e.g., foam) substance having a suitable compliance (inverse of spring constant) that absorbs stress such that stress transferred from the substrate 230 to the CMOS die 220 and/or MEMS die 210 is below a level determined likely to cause damage or performance degradation.

The gap 240 may, for example, provide for reduced stress on the CMOS die 220 and/or the MEMS die 210 due to flexing of the substrate 230. For example, the substrate 230 may bow into or away from the gap 240 while transferring a substantially lower amount of stress to the CMOS die 220 and/or the MEMS die 210 than would have been transferred without the gap 240. For example, if instead of the gap 240, the CMOS die 220 and the substrate 230 were tightly coupled over the entirety of their facing sides, the substrate 230 flexing might cause the CMOS die 220 (and thus the MEMS die 210) to also flex in unison. Such flexing of the CMOS die 220 and MEMS die 210 might, for example, cause the circuit structure 200 to fail, reduce performance of the circuit structure 200, alter performance characteristics of the circuit structure 200, etc.

As shown in FIG. 2, the stress isolation gap 240 may comprise a cavity formed in the substrate 230. The cavity may, for example, be completely or partially surrounded laterally by one or more upward-protruding portion(s) 228 of the substrate 230. For example, the upward-protruding portion(s) 228 of the substrate 230 may extend toward the entire perimeter of the CMOS die 220. Also for example, the upward-protruding portion of the substrate 230 may be segmented into two or more segments, each of which only extends toward part of the perimeter of the CMOS die 220. For example, the upward-protruding portion(s) 228 of the substrate 230 may comprise four corner posts (or feet), each protruding upward toward a respective corner of the CMOS die 220. Such posts may, for example, comprise a rectangular footprint (e.g., looking up or down at the post), a circular footprint, an elliptical footprint, etc. Also for example, as will be discussed herein, the upward-protruding portion(s) 228 may comprise a single solid protrusion or pedestal (e.g., extending from the center of the substrate 230 toward the center of the bottom side of the CMOS die 220, offset from the center of the CMOS die 220 but still covering the center, offset from the center of the CMOS die 220 and not covering the center of the CMOS die 220, etc.).

In an example implementation in which wire-bonding is utilized for electrically coupling the CMOS die 220 to the substrate 230, the upward-protruding portion(s) 228 of the substrate 230 may be positioned directly below wire-bond pads that are on the top side of the CMOS die 220. In such a configuration, the upward-protruding portion(s) 228 may provide structural support during the wire-bonding process.

The cavity and/or upward-protruding portion(s) 228 of the substrate 230 may be formed in any of a variety of manners. For example, the cavity may be etched into the top side of the substrate 230. For example, the top side of the substrate 230 may be masked at the protruding portions and chemically etched at the non-masked areas to form the cavity. Also for example, in an implementation that comprises feet protruding upward to the corners of the CMOS die 220, the cavity may be ground into the substrate 230. For example, while the substrate 230 is still in wafer or other non-singulated form, a matrix pattern may be ground into the top side of the substrate 230 to form the corner feet. The corner feet may, for example, be formed to protrude orthogonally relative to the primary plane of the substrate 230, but may also be formed at a non-orthogonal angle. The corner feet may, for example, be formed thin enough to have a spring-like compliance, which may further isolate the CMOS die 220 and MEMS die 210 from stress due to a flexing substrate 230. Additionally for example, in an implementation in which the substrate 230 comprises a lead frame (e.g., a paddle of a lead frame), the cavity may be stamped into the substrate 230.

Also for example, the upward-protruding portion(s) 238 may be positively formed on the substrate 230 (e.g., as opposed to being negatively formed by surrounding material being removed). For example, the upward-protruding portion(s) 238 may be deposited on the top side of the substrate 230. Such upward-protruding portions 238 may, for example, comprise dielectric material that is deposited (e.g., printed, sprayed, vapor-deposited, grown in a MEMS or MEMS-like process, etc.). In an example implementation, the upward-protruding portion(s) 238 may be formed of deposited photoresist material. In such an implementation, the deposited photoresist material may comprise enough adhesion to provide the mechanical coupling between the CMOS die 220 and the substrate 230 (e.g., after curing).

Also for example, such upward-protruding portion(s) 238 may be plated (e.g., electrode-based plating, electroless plating, etc.). In an example implementation the upward-protruding portion(s) 238 may comprise a metal post that is plated on the top surface of the substrate 230. In such an example implementation, the metal post may be strictly a mechanical feature, but may also be utilized as an electrical connection. Additionally, in a scenario in which the upward-protruding portions 238 comprise metal posts, other metal posts (e.g., of different dimensions than the protruding portions) or conductive features may provide electrical connections between the CMOS die 220 and the substrate 230. For further example, in a scenario in which the upward-protruding portion(s) 238 comprise metal posts, wire-bonds may be utilized to provide electrical connections between the CMOS die 220 and the substrate 230 (e.g., bonded to the top side of the CMOS die 220 and top side of the substrate 230).

The stress isolation gap 240 may be characterized by any of a variety of dimensions. For example, the gap 240 may be at least 10 microns thick. Also for example, the gap 240 may be at least 15 microns thick. In an example implementation, the gap 240 may comprise a thickness between 1% and 10% of the thickness of the CMOS die 220. In another example implementation, the gap 240 may comprise a thickness greater than 10% of the thickness of the CMOS die 220. The gap 240 may, for example, be at least 80% as wide as the CMOS die 220. Also for example, the gap 240 may be at least 90% as wide as the CMOS die 220.

Though the example circuit structure 200 shown in FIG. 2, shows the cavity corresponding to the gap 240 formed in the substrate 230, the cavity may alternatively be formed in both the CMOS die 220 and in the substrate 230. An example of such a configuration will now be discussed.

Figure 3:
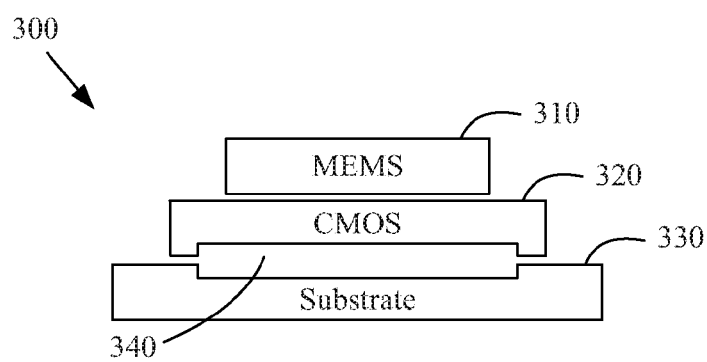
FIG. 3 shows an example electromechanical circuit structure comprising a stress isolation gap formed in a CMOS die and in a substrate, in accordance with various aspects of the present disclosure.

FIG. 3 shows an example electromechanical circuit structure 300 comprising a stress isolation gap formed in a CMOS die 320 and in a substrate 330, in accordance with various aspects of the present disclosure. The example circuit structure 300 may share any or all characteristics with the example circuit structures 100-200 illustrated in FIGS. 1-2 and discussed herein, including production methods thereof.

The example circuit structure 300 may, for example, comprise a stress isolation gap 340 formed in both the CMOS die 320 and in the substrate 330. For example, a cavity may be formed in the CMOS die 320 corresponding to the gap 340. Such cavity formation may, for example, share any or all characteristics with the cavity formation discussed with regard to the circuit structure 100 of FIG. 1. Also for example, a cavity may be formed in the substrate 330 corresponding to the gap 340. Such cavity formation may, for example, share any or all characteristics with the cavity formation discussed with regard to the circuit structure 200 of FIG. 2.

The respective cavities formed in the CMOS die 320 and in the substrate 330 may, for example, be symmetrical with regard to each other. Alternatively, such cavities may be asymmetrical. For example, the cavity formed in the CMOS die 320 may be deeper (or wider) than the cavity formed in the substrate 330. In such a scenario, the cavity formed in the substrate 330 may be kept as shallow as possible to reduce flexing in the substrate 330. For example, in an example scenario, the cavity might be formed in the substrate 330 only when the cavity formed in the CMOS die 320 does not provide enough total depth.

As shown in FIG. 3 and discussed herein, the upward-protruding portion(s) of the substrate 330 may extend beyond the lateral boundaries (or the perimeter) of the CMOS die 320, for example extending to the side edges of the substrate 330. For example, the upward-protruding portion(s) may be wider than needed for coupling to the CMOS die 320. In other implementations, the upward-protruding portion may not extend laterally to the side edge of the substrate.

Figure 4:
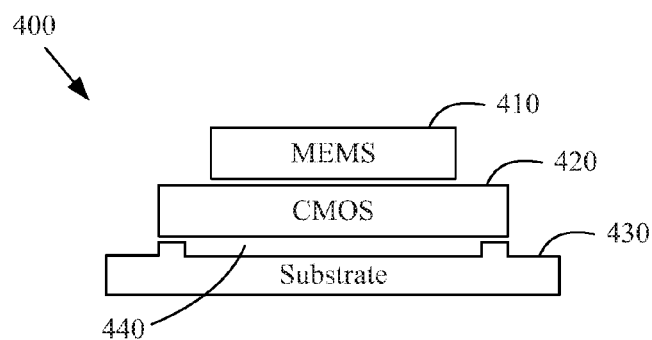
FIG. 4 shows an example electromechanical circuit structure comprising a stress isolation gap formed in a substrate, in accordance with various aspects of the present disclosure.

FIG. 4 shows an example electromechanical circuit structure 400 comprising a stress isolation gap formed in a substrate, in accordance with various aspects of the present disclosure. The example circuit structure 400 may share any or all characteristics with the example circuit structures 100-300 illustrated in FIGS. 1-3 and discussed herein, including production methods thereof.

Compared to the example circuit structure 200 illustrated in FIG. 2, the example circuit structure 400 comprises a substrate 430 that comprises an upward-protruding portion(s) that extend(s) upward at a position that is entirely laterally inward from the side edge of the substrate 430. In comparison, the upward-protruding portion(s) of the circuit structure 200 illustrated in FIG. 2 extend(s) laterally to the edges of the substrate 230. Also for example, the upward-protruding portion(s) may, for example, begin extending upward at a lateral location corresponding to an edge of the CMOS die 420, as is shown in FIG. 4.

The upward-protruding portion(s) of the substrate 430 may be formed in any of the manners discussed herein (e.g., with regard to any other substrates and/or die discussed herein). For example, the upward-protruding portion(s) of the substrate 430 may be formed in a negative manner by removing portion of the substrate 430 and/or in a positive manner by building up the upward-protruding portion(s) on the substrate 430.

Although the example circuit 400, shown in FIG. 4, shows the cavity corresponding to the gap 440 formed in the substrate 430, the cavity may alternatively be formed in both the CMOS die 420 and in the substrate 430. An example of such a configuration will now be discussed.

Figure 5:
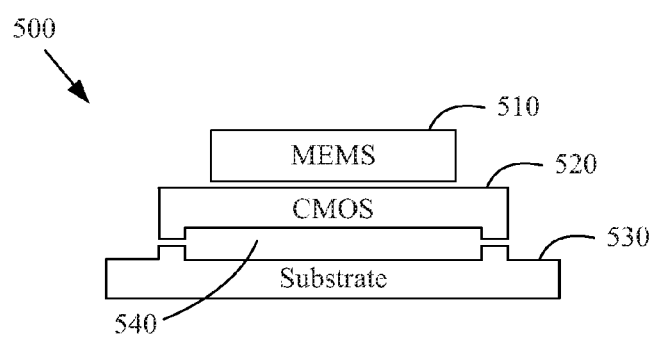
FIG. 5 shows an example electromechanical circuit structure comprising a stress isolation gap formed in a CMOS die and in a substrate, in accordance with various aspects of the present disclosure.

FIG. 5 shows an example electromechanical circuit structure 500 comprising a stress isolation gap formed in a CMOS die and in a substrate, in accordance with various aspects of the present disclosure. The example circuit structure 500 may share any or all characteristics with the example circuit structures 100-400 illustrated in FIGS. 1-4 and discussed herein, including production methods thereof.

The example circuit structure 500 may, for example, comprise a stress isolation gap 540 formed in both the CMOS die 520 and in the substrate 530. For example, a cavity may be formed in the CMOS die 520 corresponding to the gap 540. Such cavity formation may, for example, share any or all characteristics with the cavity formation discussed with regard to the circuit structure 100 of FIG. 1. Also for example, a cavity may be formed in the substrate 530 corresponding to the gap 540. Such cavity formation may, for example, share any or all characteristics with the cavity formation discussed with regard to the circuit structure 400 of FIG. 4.

The respective cavities formed in the CMOS die 520 and in the substrate 530 may, for example, be symmetrical with regard to each other. Alternatively, such cavities may be asymmetrical. For example, the cavity formed in the CMOS die 520 may be deeper (or wider) than the cavity formed in the substrate 530. In such a scenario, the cavity formed in the substrate 530 may be kept as shallow as possible to reduce flexing in the substrate 530. For example, in an example scenario, the cavity might be formed in the substrate 530 only when the cavity formed in the CMOS die 520 does not provide enough total depth.

As shown in FIG. 5 and discussed herein, the upward-protruding portion(s) of the substrate 530 may match (e.g., laterally) the downward-protruding portion(s) of the CMOS die 520. Alternatively, though not illustrated, the upward-protruding portion(s) of the substrate 530 may extend laterally beyond inner and/or outer surfaces of the downward-protruding portion(s) of the CMOS die 520. For example, the upward-protruding portion(s) of the substrate 530 may be wider than the downward-protruding portion(s) of the CMOS die 520. Also for example, though not illustrated, the downward-protruding portion(s) of the CMOS die 520 may extend laterally beyond inner and/or outer surfaces of the upward-protruding portion(s) of the substrate 530. For example, the downward-protruding portion(s) of the CMOS die 520 may be wider than the upward-protruding portion(s) of the substrate 530.

As discussed herein, upward and/or downward protrusions (or standoffs or feet) may be utilized to form the stress isolation gap, where such upward and/or downward protrusions may be integrally formed in (including on) the substrate and/or CMOS die. The standoffs may also be formed in a layer that is independent of the substrate and CMOS die and then inserted between the substrate and CMOS die during production.

Figure 6:
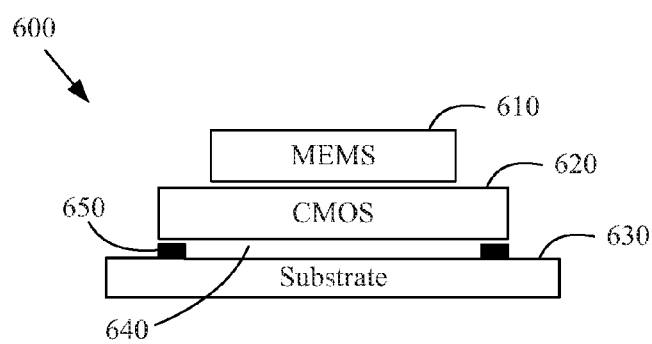
FIG. 6 shows an example electromechanical circuit structure comprising a stress isolation gap formed between a CMOS die and a substrate, in accordance with various aspects of the present disclosure.

FIG. 6 shows an example electromechanical circuit structure 600 comprising a stress isolation gap formed between a CMOS die and a substrate, in accordance with various aspects of the present disclosure. The example circuit structure 600 may, for example, comprise an intervening layer 650 that is formed independently of the CMOS die 620 and substrate 630, and then inserted between the CMOS die 620 and substrate 630 during production.

The intervening layer 650, which may also be referred to herein as a gasket 650, may comprise various shapes. For example, the gasket 650 may form a closed shape (e.g., a square, a rectangle, a circle, an ellipse, etc.). Such a closed shape may, for example, comprise height characteristics that cause the gap 640 to be sealed. Also, the closed shape may, for example, comprise height characteristics that result in an unsealed gap 640, for example with protruding standoffs and relatively thin connecting material between the standoffs. Also for example, the intervening layer 650 may comprise independent standoffs, for example placed around the perimeter of the CMOS die 620 (e.g., at each of four corners, at a single center location, etc.).

The intervening layer 650 may comprise any of a variety of materials. For example, the intervening layer 650 may comprise glass, silicon, PCB material (e.g., interposer material), die-attach film, an adhesive layer, an elastomer, etc. The intervening layer 650 may, for example, comprise a compliant material that enhances the stress isolation provided by the gap 640.

The intervening layer 650 may, for example, be applied between the CMOS die 620 and substrate 630 in wafer form and/or in a form corresponding to singulated die and/or substrates. For example, the intervening layer 650 may comprise a wafer-shaped disc of standoff material comprising apertures corresponding to the top and bottom of the gap 640 and/or protrusions corresponding to standoffs.

The intervening layer 650 (e.g., apertures, standoffs, etc.) may comprise characteristics (e.g., dimensional characteristics, material characteristics, etc.) of any of the upward- and/or downward-protruding portions discussed herein.

Figure 7:
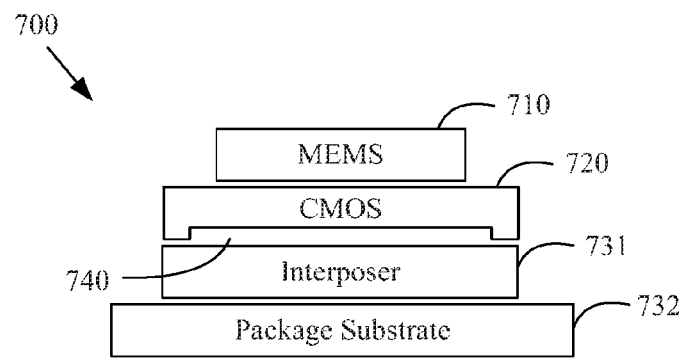
FIG. 7 shows an example electromechanical circuit structure comprising a stress isolation gap formed in a CMOS die, in accordance with various aspects of the present disclosure.
Figure 8:
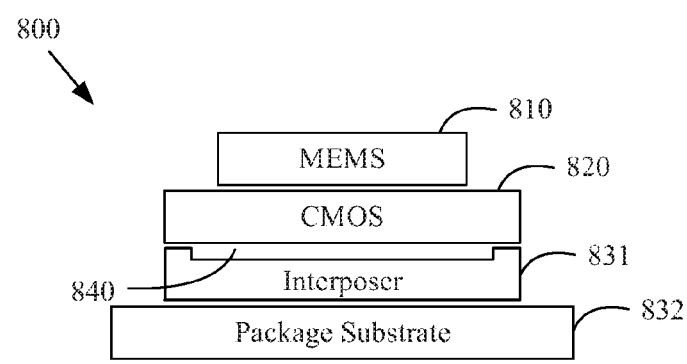
FIG. 8 shows an example electromechanical circuit structure comprising a stress isolation gap formed in an interposer, in accordance with various aspects of the present disclosure.
Figure 9:
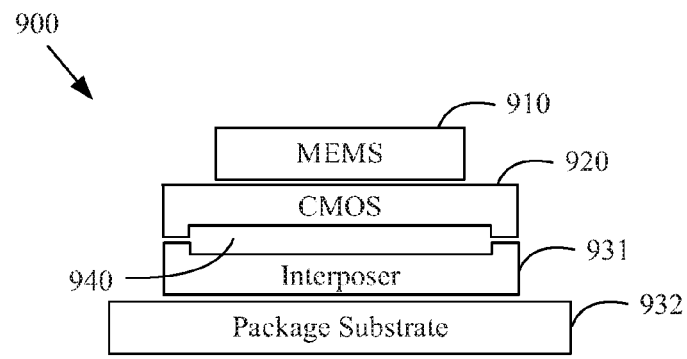
FIG. 9 shows an example electromechanical circuit structure comprising a stress isolation gap formed in a CMOS die and in an interposer, in accordance with various aspects of the present disclosure.

As discussed herein the substrates shown and discussed with regard to FIGS. 1-6 may comprise an interposer-type substrate to which a semiconductor die is bonded. FIGS. 7-9 present various non-limiting examples of interposer-based implementations.

FIG. 7 shows an example electromechanical circuit structure 700 comprising a stress isolation gap 740 formed in a CMOS die 720, in accordance with various aspects of the present disclosure.

The example circuit structure 700 may share any or all characteristics with the example circuit structures 100-600 illustrated in FIGS. 1-6 and discussed herein, including production methods thereof. The CMOS die 720 may, for example, share any or all characteristics with the CMOS die 120, 320, and 520 illustrated in FIGS. 1, 3, and 5, and discussed herein. The interposer 731 may, for example, share any or all characteristics with the substrates 130 and 630 illustrated in FIGS. 1 and 6 and discussed herein.

The interposer 731 may, for example, comprise an intervening layer between the CMOS die 720 and the package substrate 732. The interposer 731 may, for example, be mechanically and/or electrically coupled to the package substrate 732 in any of a variety of manners. The CMOS die 720 may, for example, be coupled to the interposer 731 before or after the interposer 731 is coupled to the package substrate. For example, the CMOS die 720 and the interposer 731 may be coupled to each other in wafer form, prior to singulation.

FIG. 8 shows an example electromechanical circuit structure 800 comprising a stress isolation gap 840 formed in an interposer 831, in accordance with various aspects of the present disclosure.

The example circuit structure 800 may share any or all characteristics with the example circuit structures 100-700 illustrated in FIGS. 1-7 and discussed herein, including production methods thereof. The CMOS die 820 may, for example, share any or all characteristics with the CMOS die 220, 420, 620 illustrated in FIGS. 2, 4, and 6, and discussed herein. The interposer 831 may, for example, share any or all characteristics with the substrates 230, 330, 430, and 530 illustrated in FIGS. 2, 3, 4, and 5, and discussed herein.

The interposer 831 may, for example, comprise an intervening layer between the CMOS die 820 and the package substrate 832. The interposer 831 may, for example, be mechanically and/or electrically coupled to the package substrate 832 in any of a variety of manners. The CMOS die 820 may, for example, be coupled to the interposer 831 before or after the interposer 831 is coupled to the package substrate 832. For example, the CMOS die 820 and the interposer 831 may be coupled to each other in wafer form, prior to singulation.

In an alternative example, the interposer 831 may be vertically flipped, thus positioning the gap 840 between the interposer 831 and the package substrate 832.

Though the example circuit 800 shown in FIG. 8, shows the cavity corresponding to the gap 840 formed in the interposer 831, the cavity may alternatively be formed in both the CMOS die 820 and in the interposer 831. An example of such a configuration will now be discussed.

FIG. 9 shows an example electromechanical circuit structure 900 comprising a stress isolation gap 940 formed in a CMOS die 920 and in an interposer 931, in accordance with various aspects of the present disclosure. The example circuit structure 900 may share any or all characteristics with the example circuit structures 100-800 illustrated in FIGS. 1-8 and discussed herein, including production methods thereof.

The example circuit structure 900 may, for example, comprise a stress isolation gap 940 formed in both the CMOS die 920 and in the interposer 931. For example, a cavity may be formed in the CMOS die 920 corresponding to the gap 940. Such cavity formation may, for example, share any or all characteristics with the cavity formation discussed with regard to the circuit structure 700 of FIG. 7. Also for example, a cavity may be formed in the interposer 931 corresponding to the gap 940. Such cavity formation may, for example, share any or all characteristics with the cavity formation discussed with regard to the circuit structure 800 of FIG. 8.

The respective cavities formed in the CMOS die 920 and in the interposer 931 may, for example, be symmetrical with regard to each other. Alternatively, such cavities may be asymmetrical. Examples of such cavity characteristics are discussed herein, for example with regard to FIGS. 3 and 5.

Figure 11:
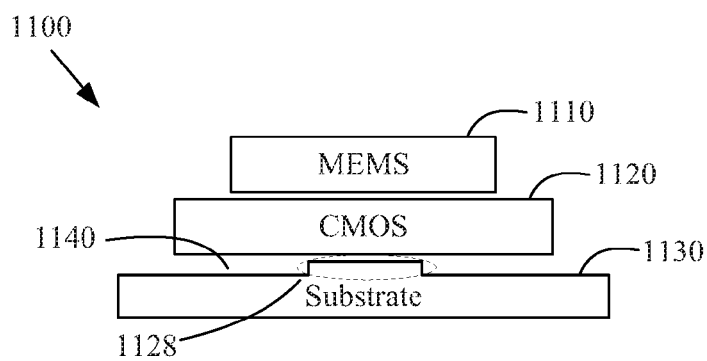
FIG. 11 shows an example electromechanical circuit structure comprising a stress isolation gap formed in a substrate, in accordance with various aspects of the present disclosure.
Figure 12:
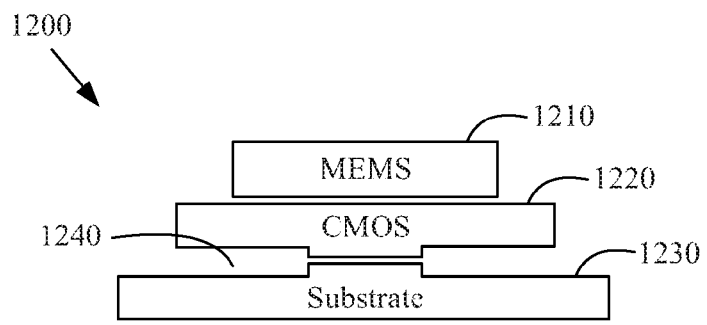
FIG. 12 shows an example electromechanical circuit structure comprising a stress isolation gap formed in a CMOS die and in a substrate, in accordance with various aspects of the present disclosure.

As discussed herein, a stress isolation gap may be formed using a single downward protrusion or foot. For example, a stress isolation gap may be formed with a single downward-protruding portion from a CMOS die and/or a single upward-protruding portion from a substrate. Examples of implementations comprising one or more of such protrusions are shown in FIGS. 10-12.

Figure 10:
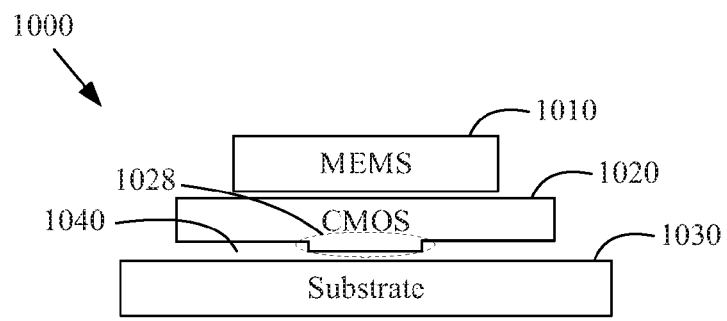
FIG. 10 shows an example electromechanical circuit structure comprising a stress isolation gap formed in a CMOS die, in accordance with various aspects of the present disclosure.

FIG. 10 shows an example electromechanical circuit structure 1000 comprising a stress isolation gap formed in a CMOS die, in accordance with various aspects of the present disclosure.

The example circuit structure 1000 may share any or all characteristics with the example circuit structures 100-900 illustrated in FIGS. 1-9 and discussed herein, including production methods thereof. For example, the example MEMS die 1010, CMOS die 1020, and substrate 1030 may share any or all characteristics with the MEMS die 110, CMOS die 120, and substrate 130 shown in FIG. 1 and discussed herein.

As discussed herein, for example with regard to FIG. 1, the CMOS die 1020 may comprise a downward-protruding 1028 portion that comprises a single solid or substantially solid protrusion (e.g., extending from the center of the bottom side of the CMOS die 1020, offset from the center of the CMOS die 1020 but still covering the center, offset from the center of the CMOS die 1020 and not covering the center of the CMOS die 1020, etc.). The isolation gap 1040 may then, for example, extend laterally from any or all sides of the downward-protruding portion 1028. For example, the isolation gap 1040 may extend laterally from the downward-protruding portion 1028 to the side edges of the CMOS die 1020. The downward-protruding portion 1028 may, for example, be formed in a same manner as any downward-protruding portions 1028 discussed herein.

The stress isolation gap 1040 may, for example, be filled with any gaseous (e.g., air) or non-gaseous (e.g., foam) substance having a suitable compliance (inverse of spring constant) that absorbs stress such that stress transferred from the substrate 1030 to the CMOS die 1020 and/or MEMS die 1010 is below a level determined likely to cause damage or performance degradation.

In an example implementation in which the CMOS die 1020 is wire-bonded to the substrate 1030, the wire-bonding may be performed in a symmetrical manner, for example balancing wire-bonding forces around the downward-protruding portion 1028 to reduce tipping forces. Also for example, a support material may be temporarily placed in the gap 1040 below the wire-bonding pads on the CMOS die 1020 to provide support during the wire-bonding process, and then such material may be removed after wire-bonding. In an example implementation, TSVs may extend through the downward-protruding portion.

Though the example circuit 1000 shown in FIG. 10, shows the cavity corresponding to the gap 1040 formed in the CMOS die 1020 (e.g., due to the downward-protruding portion of the CMOS die 1020), the cavity may alternatively be formed in the substrate 1030. An example of such a configuration will now be discussed.

FIG. 11 shows an example electromechanical circuit structure 1100 comprising a stress isolation gap formed in a substrate, in accordance with various aspects of the present disclosure.

The example circuit structure 1100 may share any or all characteristics with the example circuit structures 100-1000 illustrated in FIGS. 1-10 and discussed herein, including production methods thereof. For example, the example MEMS die 1110, CMOS die 1120, and substrate 1130 may share any or all characteristics with the MEMS die 210 and 410, CMOS die 220 and 420, and substrate 230 and 430, shown in FIGS. 2 and 4, and discussed herein.

As discussed herein, for example with regard to FIG. 2, the substrate 1130 may comprise an upward-protruding portion 1128 that comprises a single solid or substantially solid protrusion (e.g., extending from the center of the substrate 1130 toward the center of the bottom side of the CMOS die 1120, offset from the center of the CMOS die 1120 but still covering the center, offset from the center of the CMOS die 1120 and not covering the center of the CMOS die 1120, etc.). The isolation gap 1140 may then, for example, extend laterally from any or all sides of the upward-protruding portion. For example, the isolation gap 1140 may extend laterally from the upward-protruding portion to the side edges of the CMOS die 1120. The upward-protruding portion 1128 may, for example, be formed in a same manner as any upward-protruding portions discussed herein.

The gap 1140 may, for example, be filled with any gaseous (e.g., air) or non-gaseous (e.g., foam) substance having a suitable compliance (inverse of spring constant) that absorbs stress such that stress transferred from the substrate 1128 to the CMOS die 1120 and/or MEMS die 1110 is below a level determined likely to cause damage or performance degradation In an example implementation in which the CMOS die 1120 is wire-bonded to the substrate 1130, the wire-bonding may be performed in a symmetrical manner, for example balancing wire-bonding forces around the downward-protruding portion to reduce tipping forces. Also for example, a support material may be temporarily placed in the gap 1140 below the wire-bonding pads on the CMOS die 1120 to provide support during the wire-bonding process, and then such material may be removed after wire-bonding. In an example implementation, TSVs may extend through the CMOS die 1120 to the upward-protruding portion of the substrate 1130.

Though the example circuit 1100 shown in FIG. 11, shows the cavity corresponding to the gap 1140 formed in the substrate 1130 (e.g., due to the upward-protruding portion of the substrate 1130), the cavity may alternatively be formed in both the CMOS die 1120 and the substrate 1130. An example of such a configuration will now be discussed.

FIG. 12 shows an example electromechanical circuit structure 1200 comprising a stress isolation gap formed in a CMOS die and in a substrate, in accordance with various aspects of the present disclosure. The example circuit structure 1200 may share any or all characteristics with the example circuit structures 100-1100 illustrated in FIGS. 1-11 and discussed herein, including production methods thereof.

The example circuit structure 1200 may, for example, comprise a stress isolation gap 1240 formed in both the CMOS die 1220 and in the substrate 1230. For example, a cavity may be formed in the CMOS die 1220 corresponding to the gap 1240. Such cavity formation may, for example, share any or all characteristics with the cavity formation discussed with regard to the circuit structure 1000 of FIG. 10. Also for example, a cavity may be formed in the substrate 1230 corresponding to the gap 1240. Such cavity formation may, for example, share any or all characteristics with the cavity formation discussed with regard to the circuit structure 1100 of FIG. 11.

The respective cavities formed in the CMOS die 1220 and in the substrate 1230 may, for example, be symmetrical with regard to each other. Alternatively, such cavities may be asymmetrical. For example, the cavity formed in the CMOS die 1220 may be deeper (or wider) than the cavity formed in the substrate 1230. In such a scenario, the cavity formed in the substrate 1230 may be kept as shallow as possible to reduce flexing in the substrate 1230. For example, in an example scenario, the cavity might be formed in the substrate 1230 only when the cavity formed in the CMOS die 1220 does not provide enough total depth.

The upward-protruding portion of the substrate 1230 may match (e.g., laterally match) the downward-protruding portion of the CMOS die 1220. The upward-protruding portion of the substrate 1230 may also extend beyond the lateral boundaries (or the perimeter) of the downward-protruding portion of the CMOS die 1220, for example extending laterally to a position between the side edges of the CMOS die 1220 and the downward-protruding portion of the CMOS die 1220. For example, the upward-protruding portion may be wider than needed for coupling to the CMOS die 1220 (e.g., to provide for manufacturing tolerance). Similarly, the downward-protruding portion of the CMOS die 1220 may be wider than needed for coupling to the substrate 1230.

The circuit structures discussed herein may, for example, be covered by a hollow packaging lid (e.g., to further isolate the MEMS die and/or CMOS die from stress due to a flexing substrate). Also for example, the circuit structures may be at least partially encapsulated in a package encapsulant.

Figure 13:
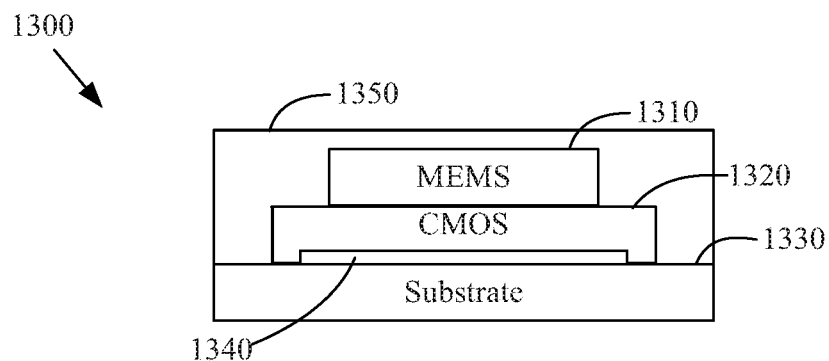
FIG. 13 shows an example electromechanical circuit structure comprising a stress isolation gap formed in a CMOS die, in accordance with various aspects of the present disclosure.

FIG. 13 shows an example electromechanical circuit structure 1300 comprising a stress isolation gap formed in a CMOS die, in accordance with various aspects of the present disclosure. The example circuit structure 1300 may share any or all characteristics with the example circuit structures 100-1200 illustrated in FIGS. 1-12 and discussed herein, including production methods thereof.

The circuit structure 1300 may, for example, comprise an encapsulant 1350. The gap 240 may, for example, be filled with any gaseous (e.g., air) or non-gaseous (e.g., foam) substance having a suitable compliance (inverse of spring constant) that absorbs stress such that stress transferred from the substrate 1340 to the CMOS die 1320 and/or MEMS die 1310 is below a level determined likely to cause damage or performance degradation. The stress isolation gap 1340 may, for example, be sealed around its edges (e.g., with an underfill material, epoxy, adhesive, etc.) prior to encapsulating. Also for example, the gap 1340 may be unsealed with the encapsulant having a degree of viscosity that inhibits the encapsulant from flowing into the gap 1340.

Figure 14:
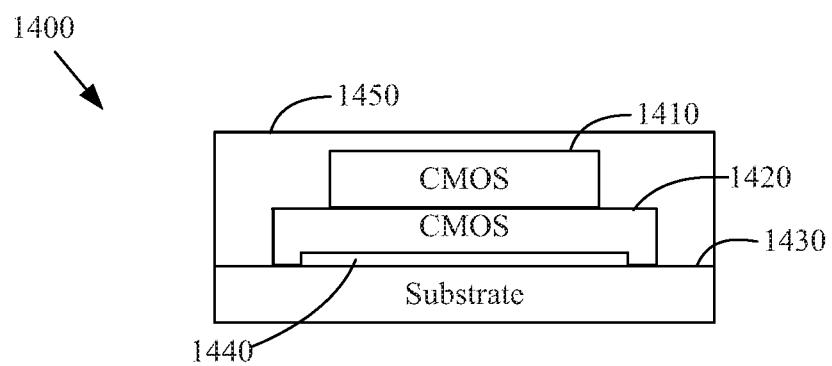
FIG. 14 shows an example circuit structure comprising a stress isolation gap formed in a CMOS die, in accordance with various aspects of the present disclosure.

The general examples discussed herein are generally presented in the context of an electromechanical circuit. Various aspects discussed herein may also apply to non-electromechanical structures. For example, in any of FIGS. 1-13, the MEMS die may be replaced with a solid-state circuit die (e.g., a second CMOS die). A non-limiting example of such a circuit structure is shown in FIG. 14, which shows an example circuit structure comprising a stress isolation gap formed in a CMOS die, in accordance with various aspects of the present disclosure.

In accordance with an example embodiment of this disclosure, a micro-electro-mechanical system (MEMS) sensor circuit or device (e.g., 100) comprises a substrate (e.g., 130), a CMOS die (120), and a MEMS die (110), each of which comprises a top side and a bottom side. The bottom side of the CMOS die is coupled to the top side of the substrate, and the bottom side of the MEMS die is coupled to the top side of the CMOS die, and there is a cavity (e.g., 140) positioned between the CMOS die and the substrate. The cavity may be sealed by a sealing substance, and may be filled with a filler substance (e.g., an adhesive) that is different than the sealing substance (e.g., a gaseous or non-gaseous substance). The cavity may be fully or partially surrounded by one or more downward-protruding portions (e.g., 128) of the CMOS die and/or one or more upward-protruding portions of the substrate (e.g. 228). The cavity may be fully or partially surrounded by one or more standoffs (e.g., 650) inserted between the CMOS die and the substrate. The cavity may be the result of material being removed from one or both of the bottom side of the CMOS die and the top side of the substrate. The cavity may be the result of one or more upward-protruding portions of the substrate and/or downward-protruding portions of the CMOS die. The one or more upward-protruding portions of the substrate and/or downward-protruding portions of the CMOS die are characterized by a compliance value (inverse of a spring constant) suitable for absorbing stress that would otherwise be transferred to the CMOS die upon flexure of the substrate.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y and z." As utilized herein, the terms "e.g.," and "for example" set off lists of one or more non-limiting examples, instances, or illustrations.

What is claimed is:

1. A micro-electro-mechanical system (MEMS) device comprising:
    a substrate comprising a top side and a bottom side;
    an integrated circuit (IC) die comprising a top side and a bottom side, where the bottom side of the IC die is coupled to the top side of the substrate;
    a MEMS die coupled to the top side of the IC die; and
    a pedestal that maintains a gap between the IC die and the substrate.

2. The MEMS device of claim 1, wherein at least a portion of the gap is filled with a gas.

3. The MEMS device of claim 1, wherein the gap extends laterally from at least three sides of the pedestal.

4. The MEMS device of claim 1, wherein the gap laterally surrounds the pedestal.

5. The MEMS device of claim 1, wherein the pedestal is the only pedestal that maintains the gap between the IC die and the substrate.

6. The MEMS device of claim 1, wherein the pedestal covers a center of the bottom side of the IC die and/or a center of the top side of the substrate.

7. The MEMS device of claim 1, wherein the pedestal comprises a downward protruding portion of the IC die and/or an upward protruding portion of the substrate.

8. A micro-electro-mechanical system (MEMS) device comprising:
    a substrate comprising a top side and a bottom side;
    an integrated circuit (IC) die comprising MEMS signal processing circuitry, the IC die comprising a top side and a bottom side that is coupled to the top side of the substrate; and
    a pedestal between the IC die and the substrate that maintains a gap between the IC die and the substrate.

9. The MEMS device of claim 8, wherein at least a portion of the gap is filled with a gas.

10. The MEMS device of claim 8, wherein the pedestal is the only pedestal that maintains the gap between the IC die and the substrate.

11. The MEMS device of claim 8, wherein the pedestal comprises a downward protruding portion of the IC die and/or an upward protruding portion of the substrate.

12. A micro-electro-mechanical system (MEMS) device comprising:
    a substrate comprising a top side and a bottom side;
    an integrated circuit (IC) die comprising a top side and a bottom side, where the bottom side of the IC die is coupled to the top side of the substrate;
    a MEMS die coupled to the top side of the IC die; and
    a gap between the IC die and the substrate and adjacent to the IC die, wherein the gap is at least partially filled with a gas.

13. The MEMS device of claim 12, wherein the gap comprises a stress isolation gap.

14. The MEMS device of claim 12, comprising a standoff that maintains the gap between the IC die and the substrate.

15. The MEMS device of claim 14, wherein the gap laterally surrounds the standoff.

16. The MEMS device of claim 14, wherein the standoff is the only standoff that maintains the gap between the IC die and the substrate.

17. The MEMS device of claim 14, wherein the standoff covers a center of the bottom side of the IC die and/or a center of the top side of the substrate.

18. The MEMS device of claim 14, wherein the standoff comprises a downward protruding portion of the IC die.

19. The MEMS device of claim 14, wherein the standoff comprises an upward protruding portion of the substrate.

20. The MEMS device of claim 14, wherein the standoff is an intervening layer between the IC die and the substrate.

* * * * *